United States Patent
Chen et al.

(10) Patent No.: US 9,349,611 B2
(45) Date of Patent: May 24, 2016

(54) STACKABLE SEMICONDUCTOR PACKAGE AND MANUFACTURING METHOD THEREOF

(71) Applicant: ADVANCED SEMICONDUCTOR ENGINEERING, INC., Kaohsiung (TW)

(72) Inventors: Chia-Ching Chen, Kaohsiung (TW); Yi-Chuan Ding, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 353 days.

(21) Appl. No.: 13/776,567

(22) Filed: Feb. 25, 2013

(65) Prior Publication Data

US 2013/0171774 A1   Jul. 4, 2013

Related U.S. Application Data

(62) Division of application No. 12/874,144, filed on Sep. 1, 2010, now Pat. No. 8,405,213.

(30) Foreign Application Priority Data

Mar. 22, 2010   (TW) ................ 99108423 A (51) Int. Cl.
*H01L 21/50* (2006.01)
*H01L 23/538* (2006.01)
(Continued)

(52) U.S. Cl.
CPC .............. *H01L 21/50* (2013.01); *H01L 21/568* (2013.01); *H01L 23/5389* (2013.01); *H01L 24/19* (2013.01); *H01L 24/20* (2013.01); *H01L 24/96* (2013.01); *H01L 25/105* (2013.01); *H01L 25/16* (2013.01); *H01L 21/561* (2013.01); *H01L 21/565* (2013.01); *H01L 23/293* (2013.01);
(Continued)

(58) Field of Classification Search
USPC ........................................... 438/121
See application file for complete search history.

(56) References Cited

U.S. PATENT DOCUMENTS 3,390,226 A   6/1968   Beyerlein
3,903,590 A   9/1975   Yokogawa
(Continued)

FOREIGN PATENT DOCUMENTS

CN   1524293 A   10/2001
CN   1442033 A   9/2003
(Continued)

OTHER PUBLICATIONS

(ASEG-024/00US) Ding et al., U.S. Appl. No. 12/753,837, filed Apr. 2, 2010 for "Wafer-Level Semiconductor Device Packages with Stacking Functionality."
(Continued)

*Primary Examiner* — Marc Armand
*Assistant Examiner* — Wilner Jean Baptiste
(74) *Attorney, Agent, or Firm* — Foley & Lardner LLP; Cliff Z. Liu; Angela D. Murch (57) ABSTRACT

A semiconductor package includes a set of stud bumps, which can be formed by wire bonding technology and can be bonded or joined to a semiconductor element to form a stacked package assembly. Since the process of bonding the semiconductor element to the stud bumps can be carried out without reflow, an undesirable deformation resulting from high temperatures can be controlled or reduced.

20 Claims, 5 Drawing Sheets

(51) Int. Cl.
*H01L 25/10* (2006.01)
*H01L 25/16* (2006.01)
*H01L 21/56* (2006.01)
*H01L 23/29* (2006.01)
*H01L 23/00* (2006.01)
*H01L 25/00* (2006.01)

(52) U.S. Cl.
CPC .............. *H01L 23/295* (2013.01); *H01L 24/05* (2013.01); *H01L 24/13* (2013.01); *H01L 24/81* (2013.01); *H01L 25/50* (2013.01); *H01L 2224/0401* (2013.01); *H01L 2224/05073* (2013.01); *H01L 2224/05082* (2013.01); *H01L 2224/05155* (2013.01); *H01L 2224/05164* (2013.01); *H01L 2224/05173* (2013.01); *H01L 2224/05644* (2013.01); *H01L 2224/1134* (2013.01); *H01L 2224/12105* (2013.01); *H01L 2224/13022* (2013.01); *H01L 2224/13124* (2013.01); *H01L 2224/13144* (2013.01); *H01L 2224/13147* (2013.01); *H01L 2224/16165* (2013.01); *H01L 2224/16225* (2013.01); *H01L 2224/21* (2013.01); *H01L 2224/211* (2013.01); *H01L 2224/215* (2013.01); *H01L 2224/221* (2013.01); *H01L 2224/81192* (2013.01); *H01L 2224/81205* (2013.01); *H01L 2224/81801* (2013.01); *H01L 2225/107* (2013.01); *H01L 2225/1052* (2013.01); *H01L 2225/1058* (2013.01); *H01L 2924/014* (2013.01); *H01L 2924/01013* (2013.01); *H01L 2924/01029* (2013.01); *H01L 2924/01033* (2013.01); *H01L 2924/01075* (2013.01); *H01L 2924/01079* (2013.01); *H01L 2924/01082* (2013.01); *H01L 2924/12042* (2013.01); *H01L 2924/15311* (2013.01); *H01L 2924/3511* (2013.01)

(56) References Cited

U.S. PATENT DOCUMENTS

| | | | |
|---|---|---|---|
| 3,959,874 A | 6/1976 | Coucoulas |
| 4,246,595 A | 1/1981 | Noyori et al. |
| 4,569,786 A | 2/1986 | Deguchi |
| 4,630,096 A | 12/1986 | Drye et al. |
| 4,717,948 A | 1/1988 | Sakai et al. |
| 4,783,695 A | 11/1988 | Eichelberger et al. |
| 4,814,205 A | 3/1989 | Arcilesi et al. |
| 4,821,007 A | 4/1989 | Fields et al. |
| 4,827,328 A | 5/1989 | Ozawa et al. |
| 4,860,166 A | 8/1989 | Nicholls |
| 4,866,501 A | 9/1989 | Shanefield |
| 4,897,708 A | 1/1990 | Clements |
| 4,907,062 A | 3/1990 | Fukushima |
| 4,939,568 A | 7/1990 | Kato et al. |
| 5,019,535 A | 5/1991 | Wojnarowski et al. |
| 5,049,980 A | 9/1991 | Saito et al. |
| 5,072,289 A | 12/1991 | Sugimoto et al. |
| 5,091,769 A | 2/1992 | Eichelberger |
| 5,111,278 A | 5/1992 | Eichelberger |
| 5,120,678 A | 6/1992 | Moore et al. |
| 5,128,831 A | 7/1992 | Fox, III et al. |
| 5,139,610 A | 8/1992 | Dunaway et al. |
| 5,140,745 A | 8/1992 | McKenzie |
| 5,149,662 A | 9/1992 | Eichelberger |
| 5,151,770 A | 9/1992 | Inoue |
| 5,151,776 A | 9/1992 | Wojnarowski et al. |
| 5,157,589 A | 10/1992 | Cole, Jr. et al. |
| 5,166,772 A | 11/1992 | Soldner et al. |
| 5,172,077 A | 12/1992 | Funada |
| 5,207,585 A | 5/1993 | Byrnes et al. |
| 5,222,014 A | 6/1993 | Lin |
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |
| 5,353,195 A | 10/1994 | Fillion et al. |
| 5,353,498 A | 10/1994 | Fillion et al. |
| 5,355,016 A | 10/1994 | Swirbel et al. |
| 5,355,580 A | 10/1994 | Tsukada |
| 5,397,997 A | 3/1995 | Tuckerman et al. |
| 5,400,948 A | 3/1995 | Sajja et al. |
| 5,422,513 A | 6/1995 | Marcinkiewicz et al. |
| 5,432,677 A | 7/1995 | Mowatt et al. |
| 5,468,681 A | 11/1995 | Pasch |
| 5,497,033 A | 3/1996 | Fillion et al. |
| 5,519,936 A | 5/1996 | Andros et al. |
| 5,527,741 A | 6/1996 | Cole et al. |
| 5,546,654 A | 8/1996 | Wojnarowski et al. |
| 5,554,887 A | 9/1996 | Sawai et al. |
| 5,557,142 A | 9/1996 | Gilmore et al. |
| 5,565,706 A | 10/1996 | Miura et al. |
| 5,567,656 A | 10/1996 | Chun |
| 5,579,207 A | 11/1996 | Hayden et al. |
| 5,583,376 A | 12/1996 | Sickler et al. |
| 5,592,025 A | 1/1997 | Clark et al. |
| 5,594,275 A | 1/1997 | Kwon et al. |
| 5,600,181 A | 2/1997 | Scott et al. |
| 5,608,265 A | 3/1997 | Kitano et al. |
| 5,639,989 A | 6/1997 | Higgins, III |
| 5,677,511 A | 10/1997 | Taylor et al. |
| 5,694,300 A | 12/1997 | Mattei et al. |
| 5,703,400 A | 12/1997 | Wojnarowski et al. |
| 5,703,761 A | 12/1997 | Heiss |
| 5,710,062 A | 1/1998 | Sawai et al. |
| 5,714,800 A | 2/1998 | Thompson |
| 5,726,493 A | 3/1998 | Yamashita et al. |
| 5,726,612 A | 3/1998 | Mandai |
| 5,729,437 A | 3/1998 | Hashimoto |
| 5,745,984 A | 5/1998 | Cole, Jr. et al. |
| 5,748,452 A | 5/1998 | Londa |
| 5,763,939 A | 6/1998 | Yamashita |
| 5,776,798 A | 7/1998 | Quan et al. |
| 5,834,340 A | 11/1998 | Sawai et al. |
| 5,841,190 A | 11/1998 | Noda et al. |
| 5,841,193 A | 11/1998 | Eichelberger |
| 5,844,315 A | 12/1998 | Melton et al. |
| 5,847,930 A | 12/1998 | Kazie |
| 5,856,705 A | 1/1999 | Ting |
| 5,861,666 A | 1/1999 | Bellaar |
| 5,864,088 A | 1/1999 | Sato et al. |
| 5,866,952 A | 2/1999 | Wojnarowski et al. |
| 5,874,784 A | 2/1999 | Aoki et al. |
| 5,883,426 A | 3/1999 | Tokuno et al. |
| 5,886,876 A | 3/1999 | Yamaguchi |
| 5,889,327 A | 3/1999 | Washida |
| 5,889,655 A | 3/1999 | Barrow |
| 5,892,290 A | 4/1999 | Chakravorty et al. |
| 5,895,229 A | 4/1999 | Carney et al. |
| 5,898,344 A | 4/1999 | Hayashi |
| 5,929,521 A | 7/1999 | Wark et al. |
| 5,945,741 A | 8/1999 | Ohsawa et al. |
| 5,966,052 A | 10/1999 | Sakai |
| 5,973,393 A | 10/1999 | Chia et al. |
| 5,977,626 A | 11/1999 | Wang et al. |
| 5,985,695 A | 11/1999 | Freyman et al. |
| 5,990,546 A | 11/1999 | Igarashi et al. |
| 5,994,773 A | 11/1999 | Hirakawa |
| 5,998,867 A | 12/1999 | Jensen et al. |
| 6,013,953 A | 1/2000 | Nishihara |
| 6,025,995 A | 2/2000 | Marcinkiewicz |
| 6,046,071 A | 4/2000 | Sawai et al. |
| 6,060,775 A | 5/2000 | Ano et al. |
| 6,072,236 A | 6/2000 | Akram et al. |
| 6,079,099 A | 6/2000 | Uchida et al. |
| 6,080,932 A | 6/2000 | Smith et al. |
| 6,087,717 A | 7/2000 | Ano et al. |
| 6,093,972 A | 7/2000 | Carney et al. |
| 6,110,608 A | 8/2000 | Tanimoto et al. |
| 6,117,704 A | 9/2000 | Yamaguchi et al. |
| 6,150,193 A | 11/2000 | Glenn |

(56) References Cited

U.S. PATENT DOCUMENTS

| | | |
|---|---|---|
| 6,154,366 A | 11/2000 | Ma et al. |
| 6,159,767 A | 12/2000 | Eichelberger et al. |
| 6,177,636 B1 | 1/2001 | Fjelstad |
| 6,177,724 B1 | 1/2001 | Sawai |
| 6,194,250 B1 | 2/2001 | Melton et al. |
| 6,195,268 B1 | 2/2001 | Eide |
| 6,198,165 B1 | 3/2001 | Yamaji et al. |
| 6,225,694 B1 | 5/2001 | Terui |
| 6,232,151 B1 | 5/2001 | Ozmat et al. |
| 6,232,650 B1 | 5/2001 | Fujisawa et al. |
| 6,232,661 B1 | 5/2001 | Amagai et al. |
| 6,239,482 B1 | 5/2001 | Fillion et al. |
| 6,242,815 B1 | 6/2001 | Hsu et al. |
| 6,255,143 B1 | 7/2001 | Briar |
| 6,261,680 B1 | 7/2001 | Denman |
| 6,265,765 B1 | 7/2001 | DiStefano et al. |
| 6,265,783 B1 | 7/2001 | Juso et al. |
| 6,271,057 B1 | 8/2001 | Lee et al. |
| 6,271,469 B1 | 8/2001 | Ma et al. |
| 6,278,181 B1 | 8/2001 | Maley |
| 6,294,406 B1 | 9/2001 | Bertin et al. |
| 6,294,741 B1 | 9/2001 | Cole, Jr. et al. |
| 6,303,997 B1 | 10/2001 | Lee |
| 6,306,680 B1 | 10/2001 | Fillion et al. |
| 6,323,045 B1 | 11/2001 | Cline et al. |
| 6,331,451 B1 | 12/2001 | Fusaro et al. |
| 6,358,780 B1 | 3/2002 | Smith et al. |
| 6,369,335 B1 | 4/2002 | Wajima |
| 6,376,769 B1 | 4/2002 | Chung |
| 6,377,461 B1 | 4/2002 | Ozmat et al. |
| 6,396,148 B1 | 5/2002 | Eichelberger et al. |
| 6,400,573 B1 | 6/2002 | Mowatt et al. |
| 6,423,566 B1 | 7/2002 | Feger et al. |
| 6,423,570 B1 | 7/2002 | Ma et al. |
| 6,426,545 B1 | 7/2002 | Eichelberger et al. |
| 6,428,942 B1 | 8/2002 | Jiang et al. |
| 6,448,174 B1 | 9/2002 | Ramm |
| 6,448,632 B1 | 9/2002 | Takiar et al. |
| 6,448,665 B1 | 9/2002 | Nakazawa et al. |
| 6,451,624 B1 | 9/2002 | Farnworth et al. |
| 6,452,258 B1 | 9/2002 | Abys et al. |
| 6,455,864 B1 | 9/2002 | Featherby et al. |
| 6,461,881 B1 | 10/2002 | Farnworth et al. |
| 6,472,598 B1 | 10/2002 | Glenn |
| 6,472,743 B2 | 10/2002 | Huang et al. |
| 6,479,903 B2 | 11/2002 | Briar |
| 6,485,595 B1 | 11/2002 | Yenni et al. |
| 6,486,005 B1 | 11/2002 | Kim |
| 6,486,006 B2 | 11/2002 | Hirano et al. |
| 6,486,545 B1 | 11/2002 | Glenn et al. |
| 6,489,676 B2 | 12/2002 | Taniguchi et al. |
| 6,492,194 B1 | 12/2002 | Bereau et al. |
| 6,501,165 B1 | 12/2002 | Farnworth et al. |
| 6,513,236 B2 | 2/2003 | Tsukamoto |
| 6,521,978 B2 | 2/2003 | Fenk et al. |
| 6,521,995 B1 | 2/2003 | Akram et al. |
| 6,525,413 B1 | 2/2003 | Cloud et al. |
| 6,552,430 B1 | 4/2003 | Perez et al. |
| 6,555,906 B2 | 4/2003 | Towle et al. |
| 6,555,908 B1 | 4/2003 | Eichelberger |
| 6,560,109 B2 | 5/2003 | Yamaguchi et al. |
| 6,566,596 B1 | 5/2003 | Askew |
| 6,580,159 B1 | 6/2003 | Fusaro et al. |
| 6,586,276 B2 | 7/2003 | Towle et al. |
| 6,586,822 B1 | 7/2003 | Vu et al. |
| 6,590,291 B2 | 7/2003 | Akagawa |
| 6,590,295 B1 | 7/2003 | Liao et al. |
| 6,602,737 B2 | 8/2003 | Wu |
| 6,614,102 B1 | 9/2003 | Hoffman et al. |
| 6,614,104 B2 | 9/2003 | Farnworth et al. |
| 6,617,687 B2 | 9/2003 | Akram et al. |
| 6,630,630 B1 | 10/2003 | Maezawa et al. |
| 6,635,953 B2 | 10/2003 | Wu |
| 6,639,324 B1 | 10/2003 | Chien |
| 6,646,354 B2 | 11/2003 | Cobbley et al. |
| 6,656,827 B1 | 12/2003 | Tsao et al. |
| 6,663,943 B2 | 12/2003 | Kadota |
| 6,663,946 B2 | 12/2003 | Seri et al. |
| 6,680,529 B2 | 1/2004 | Chen et al. |
| 6,686,649 B1 | 2/2004 | Mathews et al. |
| 6,695,985 B2 | 2/2004 | Igarashi et al. |
| 6,701,614 B2 | 3/2004 | Ding et al. |
| 6,706,554 B2 | 3/2004 | Ogura |
| 6,707,137 B2 | 3/2004 | Kim |
| 6,709,896 B1 | 3/2004 | Cobbley et al. |
| 6,709,898 B1 | 3/2004 | Ma et al. |
| 6,713,859 B1 | 3/2004 | Ma |
| 6,717,061 B2 | 4/2004 | Yamaguchi et al. |
| 6,724,061 B2 | 4/2004 | Murata |
| 6,724,638 B1 | 4/2004 | Inagaki et al. |
| 6,734,370 B2 | 5/2004 | Yamaguchi et al. |
| 6,734,534 B1 | 5/2004 | Vu et al. |
| 6,734,542 B2 | 5/2004 | Nakatani et al. |
| 6,734,696 B2 | 5/2004 | Horner et al. |
| 6,740,546 B2 | 5/2004 | Corisis et al. |
| 6,740,959 B2 | 5/2004 | Alcoe et al. |
| 6,740,964 B2 | 5/2004 | Sasaki |
| 6,747,348 B2 | 6/2004 | Jeung et al. |
| 6,750,547 B2 | 6/2004 | Jeung et al. |
| 6,756,671 B2 | 6/2004 | Lee et al. |
| 6,757,181 B1 | 6/2004 | Villanueva et al. |
| 6,759,268 B2 | 7/2004 | Akagawa |
| 6,762,503 B2 | 7/2004 | Lee |
| 6,768,061 B2 | 7/2004 | Kondo |
| 6,774,317 B2 | 8/2004 | Fjelstad |
| 6,780,746 B2 | 8/2004 | Kinsman et al. |
| 6,781,231 B2 | 8/2004 | Minervini |
| 6,787,392 B2 | 9/2004 | Quah |
| 6,787,894 B2 | 9/2004 | Jeung et al. |
| 6,790,706 B2 | 9/2004 | Jeung et al. |
| 6,798,057 B2 | 9/2004 | Bolkin et al. |
| 6,800,804 B2 | 10/2004 | Igarashi et al. |
| 6,812,066 B2 | 11/2004 | Taniguchi et al. |
| 6,815,254 B2 | 11/2004 | Mistry et al. |
| 6,818,544 B2 | 11/2004 | Eichelberger et al. |
| 6,828,665 B2 | 12/2004 | Pu et al. |
| 6,838,776 B2 | 1/2005 | Leal et al. |
| 6,845,554 B2 | 1/2005 | Frankowsky et al. |
| 6,847,109 B2 | 1/2005 | Shim |
| 6,849,945 B2 | 2/2005 | Horiuchi et al. |
| 6,856,007 B2 | 2/2005 | Warner |
| 6,861,288 B2 | 3/2005 | Shim et al. |
| 6,861,757 B2 | 3/2005 | Shimoto et al. |
| 6,865,084 B2 | 3/2005 | Lin et al. |
| 6,865,089 B2 | 3/2005 | Ho et al. |
| 6,867,480 B2 | 3/2005 | Legaspi, Jr. et al. |
| 6,872,893 B2 | 3/2005 | Fukuoka et al. |
| 6,876,544 B2 | 4/2005 | Hsin |
| 6,881,896 B2 | 4/2005 | Ebihara |
| 6,888,255 B2 | 5/2005 | Murtuza et al. |
| 6,894,399 B2 | 5/2005 | Vu et al. |
| 6,900,383 B2 | 5/2005 | Babb et al. |
| 6,902,950 B2 | 6/2005 | Ma et al. |
| 6,905,914 B1 | 6/2005 | Huemoeller et al. |
| 6,921,683 B2 | 7/2005 | Nakayama |
| 6,921,975 B2 | 7/2005 | Leal et al. |
| 6,924,550 B2 | 8/2005 | Corisis et al. |
| 6,928,719 B2 | 8/2005 | Kim et al. |
| 6,930,256 B1 | 8/2005 | Huemoeller et al. |
| 6,936,930 B2 | 8/2005 | Wang |
| 6,939,738 B2 | 9/2005 | Nakatani et al. |
| 6,948,944 B2 | 9/2005 | Ueno |
| 6,953,708 B2 | 10/2005 | Hedler et al. |
| 6,962,869 B1 | 11/2005 | Bao et al. |
| 6,964,887 B2 | 11/2005 | Akagawa |
| 6,964,889 B2 | 11/2005 | Ma et al. |
| 6,967,403 B2 | 11/2005 | Chuang et al. |
| 6,969,916 B2 | 11/2005 | Shizuno |
| 6,974,334 B2 | 12/2005 | Hung |
| 6,975,516 B2 | 12/2005 | Asahi et al. |
| 6,977,348 B2 | 12/2005 | Ho et al. |
| 6,991,966 B2 | 1/2006 | Tuominen |
| 6,992,400 B2 | 1/2006 | Tikka et al. |
| 6,998,532 B2 | 2/2006 | Kawamoto et al. |

(56) References Cited

U.S. PATENT DOCUMENTS

| | | |
|---|---|---|
| 7,002,245 B2 | 2/2006 | Huang et al. |
| 7,002,805 B2 | 2/2006 | Lee |
| 7,012,323 B2 | 3/2006 | Warner et al. |
| 7,015,075 B2 | 3/2006 | Fay et al. |
| 7,015,571 B2 | 3/2006 | Chang et al. |
| 7,019,406 B2 | 3/2006 | Huang et al. |
| 7,026,709 B2 | 4/2006 | Tsai et al. |
| 7,029,953 B2 | 4/2006 | Sasaki |
| 7,030,469 B2 | 4/2006 | Mahadevan et al. |
| 7,034,386 B2 | 4/2006 | Kurita |
| 7,045,385 B2 | 5/2006 | Kim et al. |
| 7,045,908 B2 | 5/2006 | Ohsumi |
| 7,048,450 B2 | 5/2006 | Beer et al. |
| 7,049,682 B1 | 5/2006 | Mathews et al. |
| 7,049,692 B2 | 5/2006 | Nishimura et al. |
| 7,053,475 B2 | 5/2006 | Akagawa |
| 7,061,079 B2 | 6/2006 | Weng et al. |
| 7,067,356 B2 | 6/2006 | Towle et al. |
| 7,071,024 B2 | 7/2006 | Towle et al. |
| 7,071,028 B2 | 7/2006 | Koike et al. |
| 7,078,788 B2 | 7/2006 | Vu et al. |
| 7,081,661 B2 | 7/2006 | Takehara et al. |
| 7,087,991 B2 | 8/2006 | Chen et al. |
| 7,091,595 B2 | 8/2006 | Fuergut et al. |
| 7,102,807 B2 | 9/2006 | Shi et al. |
| 7,112,467 B2 | 9/2006 | Eichelberger et al. |
| 7,122,901 B2 | 10/2006 | Sunohara et al. |
| 7,125,744 B2 | 10/2006 | Takehara et al. |
| 7,126,218 B1 | 10/2006 | Darveaux et al. |
| 7,129,576 B2 | 10/2006 | Humpston |
| 7,132,312 B2 | 11/2006 | Huang et al. |
| 7,141,884 B2 | 11/2006 | Kojima et al. |
| 7,145,228 B2 | 12/2006 | Yean et al. |
| 7,161,252 B2 | 1/2007 | Tsuneoka et al. |
| 7,163,843 B2 | 1/2007 | Kiendl et al. |
| 7,170,152 B2 | 1/2007 | Huang et al. |
| 7,173,330 B2 | 2/2007 | Eng et al. |
| 7,176,567 B2 | 2/2007 | Yang et al. |
| 7,180,012 B2 | 2/2007 | Tsuneoka et al. |
| 7,183,498 B2 | 2/2007 | Ogura et al. |
| 7,185,426 B1 | 3/2007 | Hiner et al. |
| 7,186,928 B2 | 3/2007 | Kikuchi et al. |
| 7,187,060 B2 | 3/2007 | Usui |
| 7,187,068 B2 | 3/2007 | Suh et al. |
| 7,187,070 B2 | 3/2007 | Chu et al. |
| 7,192,807 B1 | 3/2007 | Huemoeller et al. |
| 7,196,408 B2 | 3/2007 | Yang et al. |
| 7,205,674 B2 | 4/2007 | Huang et al. |
| 7,221,045 B2 | 5/2007 | Park et al. |
| 7,224,061 B2 | 5/2007 | Yang et al. |
| 7,238,602 B2 | 7/2007 | Yang et al. |
| 7,242,081 B1 | 7/2007 | Lee |
| 7,247,523 B1 | 7/2007 | Huemoeller et al. |
| 7,262,080 B2 | 8/2007 | Go et al. |
| 7,262,081 B2 | 8/2007 | Yang et al. |
| 7,262,497 B2 | 8/2007 | Fang et al. |
| 7,276,783 B2 | 10/2007 | Goller et al. |
| 7,279,784 B2 | 10/2007 | Liu |
| 7,279,789 B2 | 10/2007 | Cheng |
| 7,288,835 B2 | 10/2007 | Yim et al. |
| 7,294,529 B2 | 11/2007 | Tuominen et al. |
| 7,294,587 B2 | 11/2007 | Asahi et al. |
| 7,294,791 B2 | 11/2007 | Danoski et al. |
| 7,294,920 B2 | 11/2007 | Chen et al. |
| 7,294,922 B2 | 11/2007 | Jobetto et al. |
| 7,299,546 B2 | 11/2007 | Tuominen et al. |
| 7,309,913 B2 | 12/2007 | Shim et al. |
| 7,312,103 B1 | 12/2007 | Huemoeller et al. |
| 7,319,049 B2 | 1/2008 | Oi et al. |
| 7,327,015 B2 | 2/2008 | Yang et al. |
| 7,338,884 B2 | 3/2008 | Shimoto et al. |
| 7,338,892 B2 | 3/2008 | Wang et al. |
| 7,339,279 B2 | 3/2008 | Yang |
| 7,342,296 B2 | 3/2008 | Yang et al. |
| 7,342,303 B1 | 3/2008 | Berry et al. |
| 7,342,803 B2 | 3/2008 | Inagaki et al. |
| 7,344,917 B2 | 3/2008 | Gautham |
| 7,345,361 B2 | 3/2008 | Mallik et al. |
| 7,352,054 B2 | 4/2008 | Jobetto |
| 7,354,800 B2 | 4/2008 | Carson |
| 7,361,533 B1 | 4/2008 | Huemoeller et al. |
| 7,361,987 B2 | 4/2008 | Leal et al. |
| 7,364,944 B2 | 4/2008 | Huang et al. |
| 7,364,945 B2 | 4/2008 | Shim et al. |
| 7,364,948 B2 | 4/2008 | Lai et al. |
| 7,365,427 B2 | 4/2008 | Lu et al. |
| 7,371,617 B2 | 5/2008 | Tsai et al. |
| 7,372,141 B2 | 5/2008 | Karnezos et al. |
| 7,372,151 B1 | 5/2008 | Fan et al. |
| 7,394,663 B2 | 7/2008 | Yamashita et al. |
| 7,405,486 B2 | 7/2008 | Kato |
| 7,408,244 B2 | 8/2008 | Lee et al. |
| 7,411,306 B2 | 8/2008 | Leu et al. |
| 7,416,918 B2 | 8/2008 | Ma |
| 7,416,920 B2 | 8/2008 | Yang et al. |
| 7,417,329 B2 | 8/2008 | Chuang et al. |
| 7,420,272 B1 | 9/2008 | Huemoeller et al. |
| 7,420,273 B2 | 9/2008 | Liu et al. |
| 7,423,340 B2 | 9/2008 | Huang et al. |
| 7,425,464 B2 | 9/2008 | Fay et al. |
| 7,429,786 B2 | 9/2008 | Karnezos et al. |
| 7,429,787 B2 | 9/2008 | Karnezos et al. |
| 7,436,055 B2 | 10/2008 | Hu |
| 7,436,074 B2 | 10/2008 | Pan et al. |
| 7,445,957 B2 | 11/2008 | Huang et al. |
| 7,445,968 B2 | 11/2008 | Harrison et al. |
| 7,446,265 B2 | 11/2008 | Krohto et al. |
| 7,451,539 B2 | 11/2008 | Morris et al. |
| 7,453,148 B2 | 11/2008 | Yang et al. |
| 7,459,781 B2 | 12/2008 | Yang et al. |
| 7,473,629 B2 | 1/2009 | Tai et al. |
| 7,476,563 B2 | 1/2009 | Mangrum et al. |
| 7,478,474 B2 | 1/2009 | Koga |
| 7,482,198 B2 | 1/2009 | Bauer et al. |
| 7,485,970 B2 | 2/2009 | Hsu et al. |
| 7,488,903 B2 | 2/2009 | Kawagishi et al. |
| 7,501,310 B2 | 3/2009 | Yang et al. |
| 7,501,696 B2 | 3/2009 | Koyama et al. |
| 7,511,356 B2 | 3/2009 | Subramanian |
| 7,511,365 B2 | 3/2009 | Wu et al. |
| 7,514,767 B2 | 4/2009 | Yang |
| 7,523,551 B2 | 4/2009 | Horng et al. |
| 7,525,185 B2 | 4/2009 | Yang et al. |
| 7,528,009 B2 | 5/2009 | Chen et al. |
| 7,547,967 B2 | 6/2009 | Jobetto et al. |
| 7,550,320 B2 | 6/2009 | Wang et al. |
| 7,550,832 B2 | 6/2009 | Weng et al. |
| 7,550,836 B2 | 6/2009 | Chou et al. |
| 7,550,843 B2 | 6/2009 | Mihara |
| 7,557,307 B2 | 7/2009 | Nishizawa et al. |
| 7,557,437 B2 | 7/2009 | Yang et al. |
| 7,560,818 B2 | 7/2009 | Tsai |
| 7,564,121 B2 | 7/2009 | Sugimoto |
| 7,566,955 B2 | 7/2009 | Warner |
| 7,566,969 B2 | 7/2009 | Shimanuki |
| 7,572,676 B2 | 8/2009 | Leu et al. |
| 7,572,681 B1 | 8/2009 | Huemoeller et al. |
| 7,575,173 B2 | 8/2009 | Fuergut et al. |
| 7,576,415 B2 | 8/2009 | Cha et al. |
| 7,576,425 B2 | 8/2009 | Liu |
| 7,586,184 B2 | 9/2009 | Hung et al. |
| 7,588,951 B2 | 9/2009 | Mangrum et al. |
| 7,589,408 B2 | 9/2009 | Weng et al. |
| 7,591,067 B2 | 9/2009 | Wang |
| 7,595,226 B2 | 9/2009 | Lytle et al. |
| 7,595,553 B2 | 9/2009 | Nagamatsu et al. |
| 7,598,607 B2 | 10/2009 | Chung et al. |
| 7,598,616 B2 | 10/2009 | Yang et al. |
| 7,609,527 B2 | 10/2009 | Tuominen et al. |
| 7,612,295 B2 | 11/2009 | Takada et al. |
| 7,618,846 B1 | 11/2009 | Pagaila et al. |
| 7,619,304 B2 | 11/2009 | Bauer et al. |
| 7,619,901 B2 | 11/2009 | Eichelberger et al. |
| 7,622,733 B2 | 11/2009 | Fuergut et al. |

(56) References Cited

U.S. PATENT DOCUMENTS

| | | |
|---|---|---|
| 7,625,818 B2 | 12/2009 | Wang |
| 7,629,186 B2 | 12/2009 | Siaudeau |
| 7,629,199 B2 | 12/2009 | Huang et al. |
| 7,629,674 B1 | 12/2009 | Foster |
| 7,633,170 B2 | 12/2009 | Yang et al. |
| 7,633,765 B1 | 12/2009 | Scanlon et al. |
| 7,635,641 B2 | 12/2009 | Hurwitz et al. |
| 7,639,473 B2 | 12/2009 | Hsu et al. |
| 7,642,128 B1 | 1/2010 | Lin et al. |
| 7,642,133 B2 | 1/2010 | Wu et al. |
| 7,643,311 B2 | 1/2010 | Coffy |
| 7,655,501 B2 | 2/2010 | Yang et al. |
| 7,656,047 B2 | 2/2010 | Yang et al. |
| 7,662,667 B2 | 2/2010 | Shen |
| 7,667,318 B2 | 2/2010 | Yang et al. |
| 7,669,320 B2 | 3/2010 | Hurwitz et al. |
| 7,671,457 B1 | 3/2010 | Hiner et al. |
| 7,671,466 B2 | 3/2010 | Pu et al. |
| 7,675,157 B2 | 3/2010 | Liu et al. |
| 7,675,170 B2 | 3/2010 | Formosa |
| 7,682,972 B2 | 3/2010 | Hurwitz et al. |
| 7,692,286 B1 | 4/2010 | Huemoeller et al. |
| 7,700,411 B2 | 4/2010 | Yang et al. |
| 7,705,245 B2 | 4/2010 | Miyamoto et al. |
| 7,714,431 B1 | 5/2010 | Huemoeller et al. |
| 7,719,094 B2 | 5/2010 | Wu et al. |
| 7,723,839 B2 | 5/2010 | Yano et al. |
| 7,724,431 B2 | 5/2010 | Field et al. |
| 7,727,803 B2 | 6/2010 | Yamagata |
| 7,727,818 B2 | 6/2010 | Hsieh et al. |
| 7,728,431 B2 | 6/2010 | Harada et al. |
| 7,732,242 B2 | 6/2010 | Brunnbauer et al. |
| 7,737,539 B2 | 6/2010 | Kwon et al. |
| 7,737,565 B2 | 6/2010 | Coffy |
| 7,741,151 B2 | 6/2010 | Amrine et al. |
| 7,741,156 B2 | 6/2010 | Pagaila et al. |
| 7,745,910 B1 | 6/2010 | Olson et al. |
| 7,750,467 B2 | 7/2010 | Pu et al. |
| 7,759,163 B2 | 7/2010 | Kroeninger et al. |
| 7,763,976 B2 | 7/2010 | Tang et al. |
| 7,767,495 B2 | 8/2010 | Fuergut et al. |
| 7,772,046 B2 | 8/2010 | Pagaila et al. |
| 7,777,351 B1 | 8/2010 | Berry et al. |
| 7,799,602 B2 | 9/2010 | Pagaila et al. |
| 7,807,512 B2 | 10/2010 | Lee et al. |
| 7,812,434 B2 | 10/2010 | Yang |
| 7,829,981 B2 | 11/2010 | Hsu |
| 7,829,987 B2 | 11/2010 | Chia |
| 7,830,004 B2 | 11/2010 | Wu et al. |
| 7,834,464 B2 | 11/2010 | Meyer et al. |
| 7,838,334 B2 | 11/2010 | Yu et al. |
| 7,842,541 B1 | 11/2010 | Rusli et al. |
| 7,880,091 B2 | 2/2011 | Miyamoto et al. |
| 7,902,648 B2 | 3/2011 | Lee et al. |
| 7,932,599 B2 | 4/2011 | Kiendl et al. |
| 7,936,050 B2 | 5/2011 | Shin et al. |
| 7,939,935 B2 | 5/2011 | Chinda et al. |
| 7,948,090 B2 | 5/2011 | Manepalli et al. |
| 7,989,928 B2 | 8/2011 | Liao et al. |
| 8,015,700 B2 | 9/2011 | Nakamura et al. |
| 8,017,515 B2 | 9/2011 | Marimuthu et al. |
| 8,018,040 B2 | 9/2011 | Jang et al. |
| 8,022,511 B2 | 9/2011 | Chiu et al. |
| 8,030,750 B2 | 10/2011 | Kim et al. |
| 8,035,213 B2 | 10/2011 | Lee et al. |
| 8,039,303 B2 | 10/2011 | Shim et al. |
| 8,039,304 B2 | 10/2011 | Pagaila |
| 8,076,757 B2 | 12/2011 | Pagaila et al. |
| 8,093,690 B2 | 1/2012 | Ko et al. |
| 8,101,864 B2 | 1/2012 | Chinda et al. |
| 8,105,872 B2 | 1/2012 | Pagaila et al. |
| 8,110,902 B2 | 2/2012 | Eun et al. |
| 8,110,916 B2 | 2/2012 | Weng et al. |
| 8,193,647 B2 | 6/2012 | Hsieh et al. |
| 8,212,339 B2 | 7/2012 | Liao et al. |
| 8,212,340 B2 | 7/2012 | Liao et al. |
| 8,220,145 B2 | 7/2012 | Hiner et al. |
| 8,222,976 B2 | 7/2012 | Yasooka |
| 8,227,706 B2 | 7/2012 | Roy et al. |
| 8,230,591 B2 | 7/2012 | Chinda et al. |
| 8,278,746 B2 | 10/2012 | Ding et al. |
| 8,288,869 B2 | 10/2012 | Huang et al. |
| 8,320,134 B2 | 11/2012 | Su et al. |
| 8,330,267 B2 | 12/2012 | Chen et al. |
| 8,334,594 B2 | 12/2012 | Lo et al. |
| 8,358,001 B2 | 1/2013 | Yang et al. |
| 8,362,597 B1 | 1/2013 | Foster |
| 8,367,473 B2 | 2/2013 | Huang et al. |
| 8,368,185 B2 | 2/2013 | Lee et al. |
| 8,372,689 B2 | 2/2013 | Lee et al. |
| 8,378,466 B2 | 2/2013 | Chiu et al. |
| 8,399,776 B2 | 3/2013 | Appelt et al. |
| 8,405,213 B2 | 3/2013 | Chen et al. |
| 8,410,584 B2 | 4/2013 | An et al. |
| 8,432,022 B1 | 4/2013 | Huemoeller et al. |
| 8,450,836 B2 | 5/2013 | Uemura et al. |
| 8,471,215 B1 | 6/2013 | Kurin et al. |
| 8,569,894 B2 | 10/2013 | Su et al. |
| 8,624,374 B2 | 1/2014 | Ding et al. |
| 8,884,424 B2 | 11/2014 | Su et al. |
| 8,941,222 B2 | 1/2015 | Hunt |
| 2001/0008301 A1 | 7/2001 | Terui |
| 2002/0030266 A1 | 3/2002 | Murata |
| 2002/0053724 A1 | 5/2002 | Lai et al. |
| 2002/0056192 A1 | 5/2002 | Suwa et al. |
| 2002/0093108 A1 | 7/2002 | Grigorov |
| 2002/0127780 A1 | 9/2002 | Ma et al. |
| 2002/0153618 A1 | 10/2002 | Hirano et al. |
| 2002/0158334 A1 | 10/2002 | Vu et al. |
| 2002/0171145 A1 | 11/2002 | Higuchi et al. |
| 2002/0173069 A1 | 11/2002 | Shibata |
| 2002/0182776 A1 | 12/2002 | Fujisawa et al. |
| 2002/0192872 A1 | 12/2002 | Fujisawa et al. |
| 2003/0030137 A1 | 2/2003 | Hashimoto |
| 2003/0034553 A1 | 2/2003 | Ano |
| 2003/0077871 A1 | 4/2003 | Cheng et al. |
| 2003/0090883 A1 | 5/2003 | Asahi et al. |
| 2003/0098502 A1 | 5/2003 | Sota |
| 2003/0129272 A1 | 7/2003 | Shen et al. |
| 2003/0213990 A1 | 11/2003 | Tsai et al. |
| 2004/0012099 A1 | 1/2004 | Nakayama |
| 2004/0020673 A1 | 2/2004 | Mazurkiewicz |
| 2004/0063242 A1 | 4/2004 | Kamezos |
| 2004/0080054 A1 | 4/2004 | Chinda et al. |
| 2004/0106232 A1 | 6/2004 | Sakuyama et al. |
| 2004/0110319 A1 | 6/2004 | Fukutomi et al. |
| 2004/0124515 A1 | 7/2004 | Tao et al. |
| 2004/0126927 A1 | 7/2004 | Lin et al. |
| 2004/0150097 A1 | 8/2004 | Gaynes et al. |
| 2004/0155352 A1 | 8/2004 | Ma |
| 2004/0155354 A1 | 8/2004 | Hanaoka et al. |
| 2004/0178500 A1 | 9/2004 | Usui |
| 2004/0191955 A1 | 9/2004 | Joshi et al. |
| 2004/0201101 A1 | 10/2004 | Kang et al. |
| 2004/0231872 A1 | 11/2004 | Arnold et al. |
| 2004/0252475 A1 | 12/2004 | Tsuneoka et al. |
| 2005/0006752 A1 | 1/2005 | Ogawa |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0046001 A1 | 3/2005 | Warner |
| 2005/0054187 A1 | 3/2005 | Ding et al. |
| 2005/0062173 A1 | 3/2005 | Vu et al. |
| 2005/0110163 A1* | 5/2005 | Koo et al. ............ 257/778 |
| 2005/0112798 A1 | 5/2005 | Bjorbell |
| 2005/0117835 A1 | 6/2005 | Nguyen et al. |
| 2005/0121764 A1 | 6/2005 | Mallik et al. |
| 2005/0186704 A1 | 8/2005 | Yee et al. |
| 2005/0208702 A1 | 9/2005 | Kim |
| 2005/0212110 A1 | 9/2005 | Kato |
| 2005/0253223 A1 | 11/2005 | Marques |
| 2005/0253244 A1 | 11/2005 | Chang |
| 2005/0285147 A1 | 12/2005 | Usui et al. |

(56) References Cited

U.S. PATENT DOCUMENTS

| | | |
|---|---|---|
| 2006/0035409 A1 | 2/2006 | Suh et al. |
| 2006/0065387 A1 | 3/2006 | Tonapi et al. |
| 2006/0071315 A1 | 4/2006 | Oh et al. |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0170112 A1 | 8/2006 | Tanaka et al. |
| 2006/0220210 A1 | 10/2006 | Karnezos et al. |
| 2006/0231944 A1 | 10/2006 | Huang et al. |
| 2006/0240595 A1 | 10/2006 | Lee |
| 2006/0244117 A1 | 11/2006 | Karnezos et al. |
| 2006/0266547 A1 | 11/2006 | Koga |
| 2006/0284300 A1 | 12/2006 | Nishizawa et al. |
| 2006/0292753 A1 | 12/2006 | Takahashi |
| 2007/0025092 A1 | 2/2007 | Lee et al. |
| 2007/0029668 A1 | 2/2007 | Lin et al. |
| 2007/0030661 A1 | 2/2007 | Morris |
| 2007/0052076 A1 | 3/2007 | Ramos et al. |
| 2007/0057364 A1 | 3/2007 | Wang et al. |
| 2007/0059866 A1 | 3/2007 | Yang et al. |
| 2007/0069389 A1 | 3/2007 | Wollanke et al. |
| 2007/0090508 A1 | 4/2007 | Lin et al. |
| 2007/0096311 A1 | 5/2007 | Humpston et al. |
| 2007/0108580 A1 | 5/2007 | Goller |
| 2007/0108583 A1 | 5/2007 | Shim et al. |
| 2007/0131349 A1 | 6/2007 | Tuominen et al. |
| 2007/0145539 A1 | 6/2007 | Lam |
| 2007/0145541 A1 | 6/2007 | Lee et al. |
| 2007/0170582 A1 | 7/2007 | Nomura et al. |
| 2007/0170595 A1 | 7/2007 | Sinha |
| 2007/0176281 A1 | 8/2007 | Kim et al. |
| 2007/0190690 A1 | 8/2007 | Chow et al. |
| 2007/0221399 A1 | 9/2007 | Nishizawa et al. |
| 2007/0222054 A1 | 9/2007 | Hembree |
| 2007/0227761 A1 | 10/2007 | Tuominen et al. |
| 2007/0234563 A1 | 10/2007 | Sakaguchi et al. |
| 2007/0241437 A1 | 10/2007 | Kagaya et al. |
| 2007/0241453 A1 | 10/2007 | Ha et al. |
| 2007/0246252 A1 | 10/2007 | Buchwalter et al. |
| 2007/0246806 A1 | 10/2007 | Ong et al. |
| 2007/0252481 A1 | 11/2007 | Iwamoto et al. |
| 2007/0262422 A1 | 11/2007 | Bakalski et al. |
| 2007/0272940 A1 | 11/2007 | Lee et al. |
| 2007/0273008 A1 | 11/2007 | Suzuki |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2007/0296065 A1 | 12/2007 | Yew et al. |
| 2008/0017968 A1 | 1/2008 | Choi et al. |
| 2008/0042301 A1 | 2/2008 | Yang et al. |
| 2008/0061407 A1 | 3/2008 | Yang et al. |
| 2008/0073769 A1 | 3/2008 | Wu et al. |
| 2008/0081161 A1 | 4/2008 | Tomita et al. |
| 2008/0085572 A1 | 4/2008 | Yang |
| 2008/0087988 A1 | 4/2008 | Lee et al. |
| 2008/0089048 A1 | 4/2008 | Yamano et al. |
| 2008/0094805 A1 | 4/2008 | Tuominen et al. |
| 2008/0105967 A1 | 5/2008 | Yang et al. |
| 2008/0116564 A1 | 5/2008 | Yang et al. |
| 2008/0116574 A1 | 5/2008 | Fan |
| 2008/0128890 A1 | 6/2008 | Choi et al. |
| 2008/0136002 A1 | 6/2008 | Yang et al. |
| 2008/0136004 A1 | 6/2008 | Yang et al. |
| 2008/0136033 A1 | 6/2008 | Nagamatsu et al. |
| 2008/0136041 A1 | 6/2008 | Kotake et al. |
| 2008/0137314 A1 | 6/2008 | Salama et al. |
| 2008/0142960 A1 | 6/2008 | Leal et al. |
| 2008/0153209 A1 | 6/2008 | Liu et al. |
| 2008/0153245 A1 | 6/2008 | Lin et al. |
| 2008/0157316 A1 | 7/2008 | Yang et al. |
| 2008/0157327 A1 | 7/2008 | Yang et al. |
| 2008/0157336 A1 | 7/2008 | Yang et al. |
| 2008/0157402 A1 | 7/2008 | Ramakrishna et al. |
| 2008/0174008 A1 | 7/2008 | Yang et al. |
| 2008/0174013 A1 | 7/2008 | Yang et al. |
| 2008/0191343 A1 | 8/2008 | Liu et al. |
| 2008/0197469 A1 | 8/2008 | Yang et al. |
| 2008/0197473 A1 | 8/2008 | Chen et al. |
| 2008/0210462 A1 | 9/2008 | Kawagishi et al. |
| 2008/0230860 A1 | 9/2008 | Yen et al. |
| 2008/0230887 A1 | 9/2008 | Sun et al. |
| 2008/0237879 A1 | 10/2008 | Yang et al. |
| 2008/0246126 A1 | 10/2008 | Bowles et al. |
| 2008/0251908 A1 | 10/2008 | Yang et al. |
| 2008/0258293 A1 | 10/2008 | Yang et al. |
| 2008/0265421 A1 | 10/2008 | Brunnbauer et al. |
| 2008/0272499 A1 | 11/2008 | DeNatale et al. |
| 2008/0274593 A1 | 11/2008 | Yang et al. |
| 2008/0284017 A1 | 11/2008 | Lee et al. |
| 2008/0284035 A1 | 11/2008 | Brunnbauer et al. |
| 2008/0296697 A1 | 12/2008 | Hsu et al. |
| 2008/0303110 A1 | 12/2008 | Lee |
| 2008/0315375 A1 | 12/2008 | Eichelberger et al. |
| 2008/0315377 A1 | 12/2008 | Eichelberger et al. |
| 2008/0315391 A1 | 12/2008 | Kohl et al. |
| 2008/0315404 A1 | 12/2008 | Eichelberger et al. |
| 2008/0316714 A1 | 12/2008 | Eichelberger et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0014826 A1 | 1/2009 | Chien et al. |
| 2009/0014872 A1 | 1/2009 | Tuominen et al. |
| 2009/0025211 A1 | 1/2009 | Hiner et al. |
| 2009/0027863 A1 | 1/2009 | Karnezos |
| 2009/0035895 A1 | 2/2009 | Lee et al. |
| 2009/0039455 A1 | 2/2009 | Chien et al. |
| 2009/0045512 A1 | 2/2009 | Hedler et al. |
| 2009/0047797 A1 | 2/2009 | Anderson et al. |
| 2009/0050995 A1 | 2/2009 | Liu et al. |
| 2009/0050996 A1 | 2/2009 | Liu et al. |
| 2009/0051025 A1 | 2/2009 | Yang et al. |
| 2009/0075428 A1 | 3/2009 | Tang et al. |
| 2009/0096093 A1 | 4/2009 | Yang et al. |
| 2009/0096098 A1 | 4/2009 | Yang et al. |
| 2009/0101400 A1 | 4/2009 | Yamakoshi |
| 2009/0102003 A1 | 4/2009 | Vogt et al. |
| 2009/0102066 A1 | 4/2009 | Lee et al. |
| 2009/0108460 A1 | 4/2009 | Otremba et al. |
| 2009/0115072 A1 | 5/2009 | Rhyner et al. |
| 2009/0127680 A1 | 5/2009 | Do et al. |
| 2009/0127686 A1 | 5/2009 | Yang et al. |
| 2009/0129037 A1 | 5/2009 | Yoshino |
| 2009/0133251 A1 | 5/2009 | Tuominen et al. |
| 2009/0140394 A1 | 6/2009 | Bathan et al. |
| 2009/0140436 A1 | 6/2009 | Wang |
| 2009/0140441 A1 | 6/2009 | Camacho et al. |
| 2009/0140442 A1 | 6/2009 | Lin |
| 2009/0146297 A1 | 6/2009 | Badakere et al. |
| 2009/0152688 A1 | 6/2009 | Do et al. |
| 2009/0155959 A1 | 6/2009 | Lin et al. |
| 2009/0160046 A1 | 6/2009 | Otremba et al. |
| 2009/0160053 A1 | 6/2009 | Meyer et al. |
| 2009/0166785 A1 | 7/2009 | Camacho et al. |
| 2009/0166873 A1 | 7/2009 | Yang et al. |
| 2009/0170242 A1 | 7/2009 | Lin et al. |
| 2009/0176348 A1 | 7/2009 | Griffiths |
| 2009/0194851 A1 | 8/2009 | Chiu et al. |
| 2009/0194852 A1 | 8/2009 | Chiu et al. |
| 2009/0200648 A1 | 8/2009 | Graves, Jr. |
| 2009/0221114 A1 | 9/2009 | Xu |
| 2009/0224391 A1 | 9/2009 | Lin et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0230542 A1 | 9/2009 | Lin et al. |
| 2009/0236686 A1 | 9/2009 | Shim et al. |
| 2009/0236700 A1 | 9/2009 | Moriya |
| 2009/0236749 A1 | 9/2009 | Otremba et al. |

(56) References Cited

U.S. PATENT DOCUMENTS

| | | |
|---|---|---|
| 2009/0256244 A1 | 10/2009 | Liao et al. |
| 2009/0256247 A1 | 10/2009 | Landau et al. |
| 2009/0261466 A1* | 10/2009 | Pagaila ............... H01L 21/6835 257/686 |
| 2009/0261470 A1 | 10/2009 | Choi et al. |
| 2009/0273075 A1 | 11/2009 | Meyer-Berg |
| 2009/0278238 A1 | 11/2009 | Bonifield et al. |
| 2009/0294160 A1 | 12/2009 | Yoshimura et al. |
| 2009/0294899 A1 | 12/2009 | Pagaila et al. |
| 2009/0294911 A1 | 12/2009 | Pagaila et al. |
| 2009/0294928 A1 | 12/2009 | Kim et al. |
| 2009/0302435 A1 | 12/2009 | Pagaila et al. |
| 2009/0302439 A1 | 12/2009 | Pagaila et al. |
| 2009/0302446 A1 | 12/2009 | Lee et al. |
| 2009/0309212 A1 | 12/2009 | Shim et al. |
| 2009/0315156 A1 | 12/2009 | Harper |
| 2010/0000775 A1 | 1/2010 | Shen et al. |
| 2010/0001396 A1 | 1/2010 | Meyer et al. |
| 2010/0006330 A1* | 1/2010 | Fu ........................ H01L 21/486 174/260 |
| 2010/0006987 A1 | 1/2010 | Murugan et al. |
| 2010/0006994 A1 | 1/2010 | Shim et al. |
| 2010/0007029 A1 | 1/2010 | Do et al. |
| 2010/0013064 A1 | 1/2010 | Hsu |
| 2010/0013065 A1 | 1/2010 | Mistry et al. |
| 2010/0013081 A1 | 1/2010 | Toh et al. |
| 2010/0013102 A1 | 1/2010 | Tay et al. |
| 2010/0019359 A1 | 1/2010 | Pagaila et al. |
| 2010/0019370 A1 | 1/2010 | Pressel et al. |
| 2010/0019381 A1 | 1/2010 | Haeberlen et al. |
| 2010/0031500 A1 | 2/2010 | Eichelberger et al. |
| 2010/0032091 A1 | 2/2010 | Eichelberger et al. |
| 2010/0032764 A1 | 2/2010 | Andry et al. |
| 2010/0032815 A1 | 2/2010 | An et al. |
| 2010/0032818 A1 | 2/2010 | Pilling et al. |
| 2010/0032821 A1 | 2/2010 | Pagaila et al. |
| 2010/0035384 A1 | 2/2010 | Eichelberger et al. |
| 2010/0044855 A1 | 2/2010 | Eichelberger et al. |
| 2010/0047970 A1 | 2/2010 | Eichelberger et al. |
| 2010/0052135 A1 | 3/2010 | Shim et al. |
| 2010/0059853 A1 | 3/2010 | Lin et al. |
| 2010/0059854 A1 | 3/2010 | Lin et al. |
| 2010/0059898 A1 | 3/2010 | Keeth et al. |
| 2010/0072599 A1 | 3/2010 | Camacho et al. |
| 2010/0072618 A1 | 3/2010 | Camacho et al. |
| 2010/0078776 A1 | 4/2010 | Barth et al. |
| 2010/0078777 A1 | 4/2010 | Barth et al. |
| 2010/0078779 A1 | 4/2010 | Barth et al. |
| 2010/0084759 A1 | 4/2010 | Shen |
| 2010/0096739 A1 | 4/2010 | Kawabata et al. |
| 2010/0109132 A1 | 5/2010 | Ko et al. |
| 2010/0110656 A1 | 5/2010 | Ko et al. |
| 2010/0133704 A1 | 6/2010 | Marimuthu et al. |
| 2010/0140736 A1 | 6/2010 | Lin et al. |
| 2010/0140759 A1 | 6/2010 | Pagaila et al. |
| 2010/0140771 A1 | 6/2010 | Huang et al. |
| 2010/0140779 A1 | 6/2010 | Lin et al. |
| 2010/0163295 A1 | 7/2010 | Roy et al. |
| 2010/0171205 A1 | 7/2010 | Chen et al. |
| 2010/0171206 A1 | 7/2010 | Chu et al. |
| 2010/0171207 A1 | 7/2010 | Shen et al. |
| 2010/0200951 A1 | 8/2010 | Lin et al. |
| 2010/0207257 A1 | 8/2010 | Lee et al. |
| 2010/0207258 A1 | 8/2010 | Eun et al. |
| 2010/0207259 A1 | 8/2010 | Liao et al. |
| 2010/0214780 A1 | 8/2010 | Villard |
| 2010/0219514 A1 | 9/2010 | Ohguro |
| 2010/0221873 A1 | 9/2010 | Marimuthu et al. |
| 2010/0224983 A1 | 9/2010 | Huang et al. |
| 2010/0230795 A1* | 9/2010 | Kriman et al. ................ 257/686 |
| 2010/0233831 A1 | 9/2010 | Pohl et al. |
| 2010/0237477 A1 | 9/2010 | Pagaila et al. |
| 2010/0244208 A1 | 9/2010 | Pagaila et al. |
| 2010/0270661 A1 | 10/2010 | Pagaila et al. |
| 2010/0276792 A1 | 11/2010 | Chi et al. |
| 2010/0288541 A1 | 11/2010 | Appelt et al. |
| 2010/0289126 A1 | 11/2010 | Pagaila et al. |
| 2010/0289132 A1 | 11/2010 | Huang et al. |
| 2010/0308449 A1 | 12/2010 | Yang et al. |
| 2010/0314726 A1 | 12/2010 | Mueller et al. |
| 2010/0314744 A1 | 12/2010 | Huang et al. |
| 2010/0314746 A1 | 12/2010 | Hsieh et al. |
| 2010/0320585 A1 | 12/2010 | Jiang et al. |
| 2010/0320593 A1 | 12/2010 | Weng et al. |
| 2010/0320610 A1 | 12/2010 | Huang et al. |
| 2010/0326707 A1 | 12/2010 | Kwon et al. |
| 2011/0006408 A1 | 1/2011 | Liao |
| 2011/0010509 A1 | 1/2011 | Flores et al. |
| 2011/0018118 A1 | 1/2011 | Hsieh et al. |
| 2011/0018124 A1 | 1/2011 | Yang et al. |
| 2011/0037169 A1 | 2/2011 | Pagaila et al. |
| 2011/0049704 A1 | 3/2011 | Sun et al. |
| 2011/0057301 A1 | 3/2011 | Chen et al. |
| 2011/0068433 A1 | 3/2011 | Kim et al. |
| 2011/0068453 A1 | 3/2011 | Cho et al. |
| 2011/0068459 A1 | 3/2011 | Pagaila et al. |
| 2011/0074008 A1 | 3/2011 | Hsieh |
| 2011/0084370 A1 | 4/2011 | Su et al. |
| 2011/0084372 A1 | 4/2011 | Su et al. |
| 2011/0101509 A1 | 5/2011 | Han et al. |
| 2011/0115059 A1 | 5/2011 | Lee et al. |
| 2011/0115060 A1 | 5/2011 | Chiu et al. |
| 2011/0115066 A1 | 5/2011 | Kim et al. |
| 2011/0115082 A1 | 5/2011 | Gluschenkov et al. |
| 2011/0117700 A1 | 5/2011 | Weng et al. |
| 2011/0127654 A1 | 6/2011 | Weng et al. |
| 2011/0140364 A1 | 6/2011 | Head |
| 2011/0156251 A1 | 6/2011 | Chu et al. |
| 2011/0169150 A1 | 7/2011 | Su et al. |
| 2011/0177654 A1 | 7/2011 | Lee et al. |
| 2011/0194265 A1 | 8/2011 | Su et al. |
| 2011/0227219 A1 | 9/2011 | Alvarado et al. |
| 2011/0227220 A1 | 9/2011 | Chen et al. |
| 2011/0241192 A1 | 10/2011 | Ding et al. |
| 2011/0241193 A1 | 10/2011 | Ding et al. |
| 2011/0241194 A1 | 10/2011 | Chen et al. |
| 2011/0260302 A1 | 10/2011 | Bakalski et al. |
| 2011/0278703 A1 | 11/2011 | Pagaila et al. |
| 2011/0278741 A1 | 11/2011 | Chua et al. |
| 2011/0298109 A1 | 12/2011 | Pagaila et al. |
| 2011/0309488 A1 | 12/2011 | Pagaila |
| 2012/0038053 A1 | 2/2012 | Oh et al. |
| 2012/0056321 A1 | 3/2012 | Pagaila |
| 2012/0074538 A1 | 3/2012 | Tsai et al. |
| 2012/0077311 A1 | 3/2012 | Kim et al. |
| 2012/0098109 A1 | 4/2012 | Ko et al. |
| 2012/0104570 A1 | 5/2012 | Kim |
| 2012/0104571 A1 | 5/2012 | Yoo |
| 2012/0104572 A1 | 5/2012 | Yoo |
| 2012/0104573 A1 | 5/2012 | Pagaila et al. |
| 2012/0112326 A1 | 5/2012 | Pagaila et al. |
| 2012/0119373 A1 | 5/2012 | Hunt |
| 2012/0153472 A1 | 6/2012 | Pagaila et al. |
| 2012/0153493 A1 | 6/2012 | Lee et al. |
| 2012/0175732 A1 | 7/2012 | Lin et al. |
| 2012/0199958 A1 | 8/2012 | Horibe |
| 2012/0199972 A1 | 8/2012 | Pagaila et al. |
| 2012/0235309 A1 | 9/2012 | Essig et al. |
| 2012/0247275 A1 | 10/2012 | Yang et al. |
| 2012/0292749 A1 | 11/2012 | Pagaila et al. |
| 2012/0306063 A1 | 12/2012 | Kimura et al. |
| 2013/0228904 A1 | 9/2013 | Brunnbauer et al. |

FOREIGN PATENT DOCUMENTS

| | | |
|---|---|---|
| CN | 1774804 A | 5/2006 |
| CN | 1873935 A | 12/2006 |
| CN | 100536127 C | 9/2009 |
| CN | 100536127 C | 9/2009 |
| CN | 201110050611.3 | 10/2012 |
| FR | 2572849 | 5/1986 |
| GB | 2 130 794 | 6/1984 |
| JP | 55044737 | 3/1980 |
| JP | 58122759 | 7/1983 |

(56) References Cited

FOREIGN PATENT DOCUMENTS

| | | |
|---|---|---|
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |
| JP | 04206858 | 7/1992 |
| JP | 05129476 | 5/1993 |
| JP | 2007-335783 | 12/1995 |
| JP | 08288686 | 1/1996 |
| JP | 10-125819 A | 5/1998 |
| JP | 2000-294720 | 10/2000 |
| JP | 2001-298115 | 10/2001 |
| JP | 2002-158312 | 5/2002 |
| JP | 2002-170906 | 6/2002 |
| JP | 2003273571 | 9/2003 |
| JP | 2004007006 | 1/2004 |
| JP | 2004-327855 | 11/2004 |
| JP | 2009-054686 | 3/2009 |
| KR | 20020043435 | 6/2002 |
| KR | 20030001963 | 1/2003 |
| TW | 529155 | 4/2003 |
| TW | 229927 | 3/2005 |
| TW | 1236323 | 7/2005 |
| TW | 200611305 | 11/2006 |
| TW | 200828540 | 7/2008 |
| TW | 200849503 | 12/2008 |
| TW | 200924137 | 6/2009 |
| TW | 200941637 A | 10/2009 |
| TW | 200941637 A | 10/2009 |
| TW | 200947607 | 11/2009 |
| WO | WO 0233751 | 4/2002 |
| WO | WO 2004/060034 | 7/2004 |
| WO | WO 2006/076613 | 7/2006 |
| WO | WO-2009/115449 | 9/2009 |
| WO | WO 2010/035866 | 4/2010 |

OTHER PUBLICATIONS (ASEG-025/00US) Chen et al., U.S. Appl. No. 12/753,843, filed Apr. 2, 2010 for "Stacked Semiconductor Device Package Assemblies with Reduced Wire Sweep and Manufacturing Methods Thereof."

(ASEG-047/00US) Lee et al., U.S. Appl. No. 12/972,046, filed Dec. 17, 2010 for "Embedded Component Device and Manufacturing Methods Thereof."

(ASEG-053/00US) Hunt et al., U.S. Appl. No. 12/944,697, filed Nov. 11, 2010 for "Wafer Level Semiconductor Package and Manufacturing Methods Thereof."

(ASEG-056/01US) Chen et al., U.S. Appl. No. 12/874,144, filed Sep. 1, 2010 for "Stackable Semiconductor Package and Manufacturing Method Thereof."

Appelt et al., "Coreless substrates status." Proc. EPTC 2010 (12th Electronics Packaging Tech. Conf, Singapore (2010).

Appelt, et al. "A new, cost effective coreless substrate technology." Proc. ICSJ, The IEEE CPMT Symposium Japan, Univ. Tokyo, Tokyo Japan (2010).

Appelt et al., "Single sided substrates and packages based on laminate materials." APM-Microtech, Cambridge UK (Mar. 2010).

Appelt et al., "Single sided substrates—a new opportunity for miniaturizing packages." ICEP (Int'l Conf. on Electronics Packaging), Hokkaido, Japan (May 2010).

Kikuchi, et al., "High-performance FCBGA based on ultra-thin packaging substrante," NEC J. Adv. Tech. vol. 2:3 pp. 222-228 (2005).

Samsung, "Overview Buildup CSP", (downloaded Dec. 17, 2010) https://sem.samsung.co.kr/en/product/print.html.

CitiBus Hybrid Electric StarTrans, CitiBus HD Senator, http://www.azuredynamics.com/products/citibus-hybrid-electric.htm; retrieved on Sep. 17, 2008, 2 pages.

Dreiza et al., "High Density PoP (Package-on-Package) and Package Stacking Development" Electronic Components and Technology Conf. (May 2007).

IMBERA Corp., IMB Technology. www.imberacorp.com (undated).

Non-Final Office Action dated Oct. 7, 2013 for U.S. Appl. No. 12/955,782 21 pages.

Search Report for Taiwan Application No. TW 100106679 dated Mar. 7, 2014 (English machine translation) 1 page.

TW200739875 English Abstract Only.

TW-200739875(Also published as CN1873965A).

Weng et al. U.S. Appl. No. 12/648,270, filed Dec. 28, 2009 entitled "Chip Package Structure and Manufacturing Methods Thereof."

WO 2002033751 corresp to CN1524293.

Yoshida et al., A Study on Package Stacking Process for Package-on-Package (PoP) Electronic Components and Tech. Conf. (ECTC), May 2006, San Diego, CA.

* cited by examiner

STACKABLE SEMICONDUCTOR PACKAGE AND MANUFACTURING METHOD THEREOF

CROSS REFERENCE TO RELATED APPLICATIONS

This is a divisional of U.S. application Ser. No. 12/874,144 filed Sep. 1, 2010, which claims the benefit of Taiwan Application No. 99108423, filed on Mar. 22, 2010, the disclosures of which are incorporated herein by reference in their entirety.

FIELD OF THE INVENTION

The invention relates, in general, to a semiconductor package and a manufacturing method thereof, and, more particularly, to a semiconductor package including a stud bump and a manufacturing method thereof.

BACKGROUND

A conventional stacked semiconductor structure is formed by stacking semiconductor packages. Each semiconductor package includes solder balls formed on the semiconductor package by a reflow process. The adjacent and stacked semiconductor packages are electrically connected through solder balls by a reflow process.

Before stacking, a reflow process is applied to semiconductor packages to form solder balls, and, during stacking, the reflow process is again applied to the semiconductor packages. That is, the reflow process is applied to each semiconductor package at least twice. However, high temperatures during the reflow process can lead to warpage of the semiconductor packages, causing the resulting stacked semiconductor structure to be deformed.

It is against this background that a need arose to develop the semiconductor packages and the methods described herein.

SUMMARY

Embodiments of the invention are directed to a semiconductor package and a manufacturing method thereof. The semiconductor package includes a stud bump formed by wire bonding technology, and the stub bump allows bonding to another semiconductor package or device. Since the process of bonding to the stud bump can be carried out without a reflow process, deformation associated with the reflow process can be avoided or reduced.

According to a first aspect of an embodiment of the invention, a semiconductor package is provided. The semiconductor package includes a semiconductor device, a package body, a first dielectric layer, a first patterned conductive layer, a via conductive structure, a second patterned conductive layer, and a stud bump. The semiconductor device includes a side surface, an active surface, and a back surface opposite to the active surface, and includes a pad formed adjacent to the active surface. The package body includes a via, a first package surface, and a second package surface opposite to the first package surface. The via extends from the first package surface to the second package surface. The package body covers the back surface and the side surface. The first dielectric layer is formed adjacent to the first package surface and defines a first aperture from which the via is exposed. The via conductive structure is formed in the via. The first patterned conductive layer is formed adjacent to the first dielectric layer and extends to the via conductive structure. The second patterned conductive layer is formed adjacent to the second package surface and extends to the via conductive structure. The stud bump is formed adjacent to the second patterned conductive layer.

According to a second aspect of an embodiment of the invention, a manufacturing method is provided. The manufacturing method includes the following operations. A carrier with an adhesive layer is provided. A plurality of semiconductor devices are disposed adjacent to the adhesive layer, wherein each semiconductor device includes a side surface, an active surface, and a back surface opposite to the active surface, and includes a pad formed adjacent to the active surface and facing the adhesive layer. The side surface and the back surface of each semiconductor device are covered by a package body, wherein the package body includes a first package surface and a second package surface opposite to the first package surface. A plurality of vias are formed in the package body, wherein the vias extend from the first package surface to the second package surface. The carrier and the adhesive layer are removed so that the first package surface exposes the pad of each semiconductor device. A first dielectric layer is formed adjacent to the first package surface, wherein the first dielectric layer defines a plurality of first apertures from which the vias are exposed. A via conductive structure is formed in each via. A first patterned conductive layer is formed adjacent to the first dielectric layer and extending to the via conductive structure. A second patterned conductive layer is formed adjacent to the second package surface and extending to the via conductive structure. A stud bump is formed adjacent to the second patterned conductive layer by wire bonding technology. The package body is singulated to form separated semiconductor packages.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a component can include multiple components unless the context clearly dictates otherwise.

As used herein, the term "set" refers to a collection of one or more components. Thus, for example, a set of components can include a single component or multiple components. Components of a set also can be referred as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "upper," "upwardly," "lower," "downwardly," "vertical," "vertically," "lateral," "laterally," "side," "above," and "below," refer to an orientation of a set of components with respect to one another, such as in accordance with the drawings, but do not require a particular orientation of those components during manufacturing or use.

As used herein, the terms "connect," "connected," "connecting," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 1:
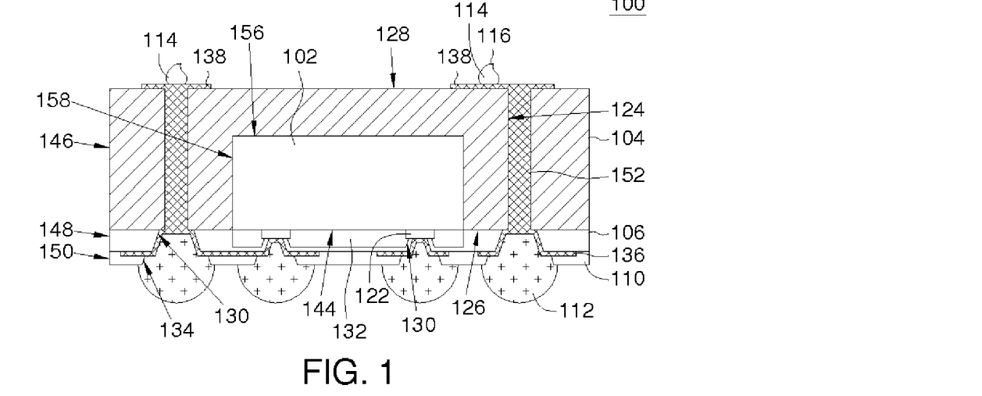
FIG. 1 shows a cross-sectional view of a semiconductor package according to an embodiment of the invention.

Referring to FIG. 1, a stackable semiconductor package 100 according to an embodiment of the invention is shown. The semiconductor package 100 includes a set of vias or through-holes 124, a semiconductor device 102 (e.g., a chip or other active or passive semiconductor device), a package body 104, a first dielectric layer 106, a first patterned conductive layer 136, a set of via conductive structures 152, a second patterned conductive layer 138, a second dielectric layer 110, and a set of solder balls 112. In the illustrated embodiment, the semiconductor package 100 also includes a set of stacking elements that provide stacking functionality, and, in particular, includes a set of first stud bumps 114.

The package body 104, which can be formed from a resin or other encapsulant, includes a first package surface 126 and a second package surface 128 opposite to the first package surface 126.

The second patterned conductive layer 138 is formed adjacent to the second package surface 128, and the first stud bumps 114 are formed adjacent to the second patterned conductive layer 138. The second patterned conductive layer 138 can be formed from a metal, a metal alloy, or other electrically conductive material. At least one of the first stud bumps 114 (at the left-hand side of FIG. 1 for example) can overlap a corresponding via 124, and at least one of the first stud bumps 114 (at the right-hand side of FIG. 1) and a corresponding via 124 can be separated by a particular distance along a lateral extending direction of the second package surface 128.

The first stud bumps 114 can be formed by wire bonding technology, and each of the first stud bumps 114 includes a base portion and a protruded neck or twisting-off portion 116, which has a shape resulting from a wire being twisted off by a wiring tool.

Figure 2:
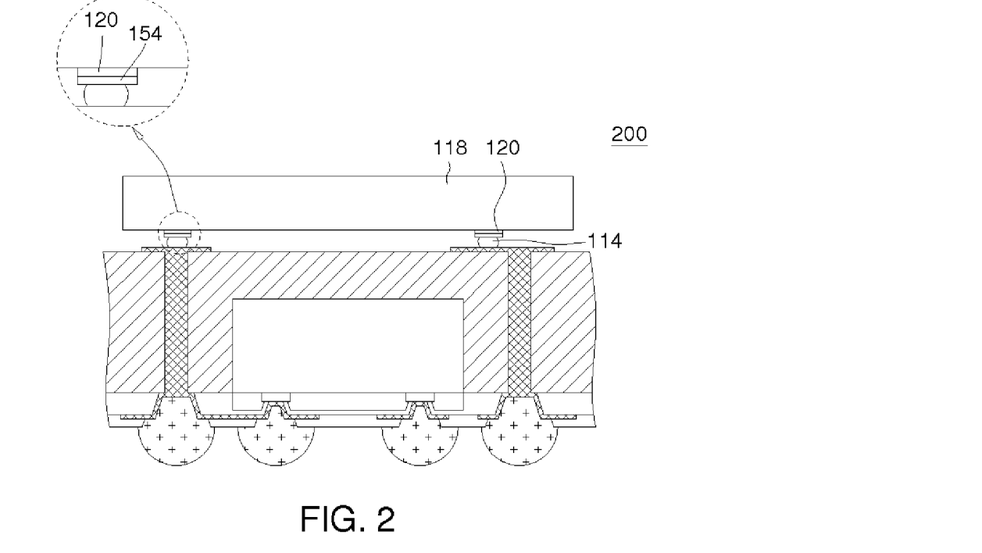
FIG. 2 shows a cross-sectional view of a stacked package assembly according to an embodiment of the invention.

Referring to FIG. 2, a cross-sectional view of a stacked package assembly 200 according to an embodiment of the invention is shown. The assembly 200 includes the semiconductor package 100 and further includes a semiconductor element 118, such as a chip or another semiconductor package. The semiconductor element 118 includes a set of second pads 120. While two semiconductor elements are shown in FIG. 2, it is contemplated that three or more semiconductor elements can be included in the assembly 200.

In the illustrated embodiment, a process of bonding the second pads 120 of the semiconductor element 118 to the first stud bumps 114 need not involve a reflow process. Rather, the bonding process can be implemented by ultrasonic bonding technology or other technology to achieve bonding with reduced temperatures. Subsequent to the bonding process, the first stud bumps 114 can take on a more rounded or oval shape, as indicated in FIG. 2.

The first stud bumps 114 can be formed from a metal or a combination of metals, such as gold (Au), aluminum (Al), copper (Cu), or metal alloys thereof. However, this list is by way of example, and the first stud bumps 114 can be formed from other electrically conductive materials. For certain implementations, gold can be desirable, since the softness of gold can be conducive to achieving bonding by applying ultrasonic energy.

Since the process of bonding the semiconductor element 118 to the first stud bumps 114 need not involve a reflow process, the number of high-temperature processes applied to the assembly 200 is reduced, thereby controlling or reducing deformation of the assembly 200.

In addition, each of the second pads 120 of the semiconductor element 118 includes a pad protection layer 154, which is formed as an outermost layer of the second pads 120 by electroplating or sputtering for connecting to the first stud bumps 114. The pad protection layer 154 can control or reduce oxidation and other damage of the second pads 120, and also can increase bonding strength or cohesion between the second pads 120 and the first stud bumps 114. The pad protection layer 154 can be formed from a nickel (Ni) layer and a gold (Au) layer, or formed from a nickel layer, a palladium (Pa) layer, and a gold layer, wherein the gold layer of the pad protection layer 154 can be formed as an outermost layer so as to be connected to the first stud bumps 114.

Referring to FIG. 1, the semiconductor device 102 includes a side surface 158, an active surface 144, and a back surface 156 opposite to the active surface 144, and also includes a set of first pads 122 and a device protection layer 132. The first pads 122 and the device protection layer 132 are formed adjacent to the active surface 144 of the semiconductor device 102. The side surface 158 extends between the active surface 144 and the back surface 156. As shown in FIG. 1, the device protection layer 132 exposes the first pad 122, and the package body 104 covers the back surface 156 and the side surface 158 of the semiconductor device 102, while exposing the first pads 122.

The first dielectric layer 106 is formed adjacent to the first package surface 126, and defines, or is formed with, a set of first apertures 130 from which the vias 124 and the first pads 122 are exposed.

The first patterned conductive layer 136 is formed adjacent to the first dielectric layer 106 and at least partially extends into the first apertures 130. The via conductive structures 152 are formed in and extend vertically along respective ones of the vias 124. Each of the via conductive structures 152 can be a hollow structure in the form of a thin, plated layer formed adjacent to an inner wall of a respective via 124, or can be a solid structure in the form of a conductive column or rod filling (e.g., substantially filling) the via 124. The first patterned conductive layer 136 and the via conductive structures 152 can be formed from a metal, a metal alloy, or other electrically conductive material.

The second patterned conductive layer 138 is formed adjacent to the second package surface 128 and extends to the via conductive structures 152. In such manner, the second patterned conductive layer 138 is electrically connected to the first patterned conductive layer 136 through the via conductive structures 152.

The second dielectric layer 110 is formed adjacent to the first patterned conductive layer 136, and defines, or is formed with, a set of second apertures 134 from which the via conductive structures 152 and a portion of the first patterned conductive layer 136 are exposed. Each of the dielectric layers 106 and 110 can be formed from a dielectric material that is polymeric or non-polymeric. For example, at least one of the dielectric layers 106 and 110 can be formed from polyimide, polybenzoxazole, benzocyclobutene, or a combination thereof. For certain implementations, at least one of the dielectric layers 106 and 110 can be formed from a dielectric material that is photoimageable or photoactive, thereby reducing manufacturing cost and time by allowing patterning using photolithography. While two dielectric layers 106 and 110 are illustrated in FIG. 1, it is contemplated that more or less dielectric layers can be included for other implementations.

The solder balls 112 are correspondingly formed or disposed in the second apertures 134 and are electrically connected to the via conductive structures 152 and the first pads 122. The solder balls 112 can be electrically connected to an external circuit, such as a printed circuit board (PCB), a semiconductor device, or another semiconductor package.

Figure 3:
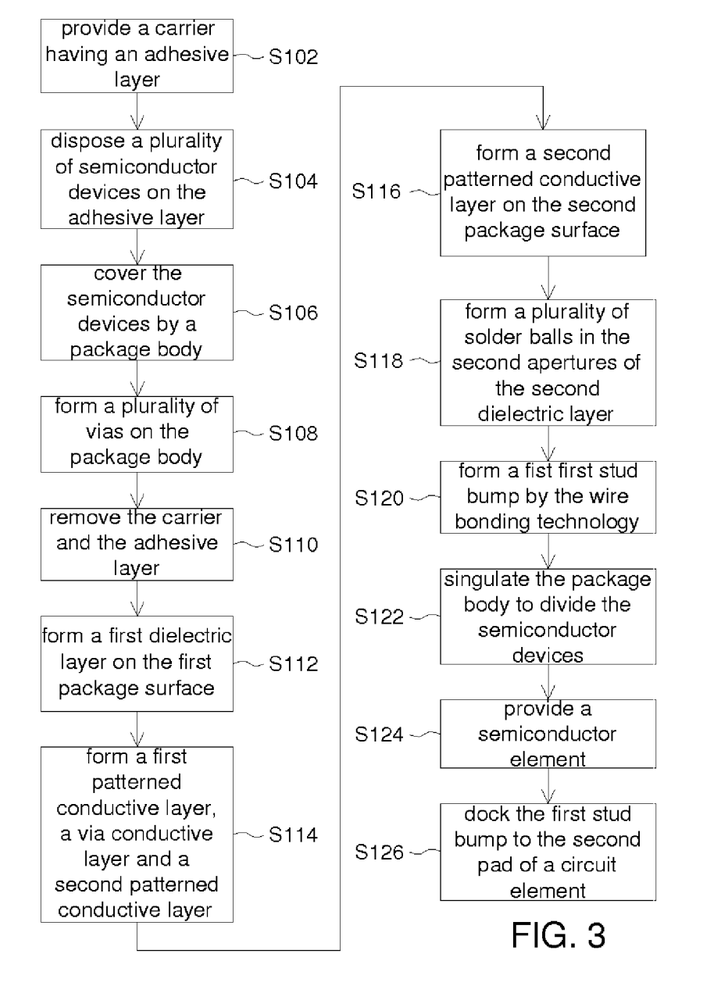
FIG. 3 shows a manufacturing method of the semiconductor package of FIG. 1 and the stacked package assembly of FIG. 2, according to an embodiment of the invention.

A manufacturing method of the semiconductor package 100 of FIG. 1 is disclosed below in FIG. 3 and FIG. 4A through FIG. 4F. FIG. 3 shows a flow chart of the method, and FIG. 4A through FIG. 4F show manufacturing operations of the method.

Figure 4A:
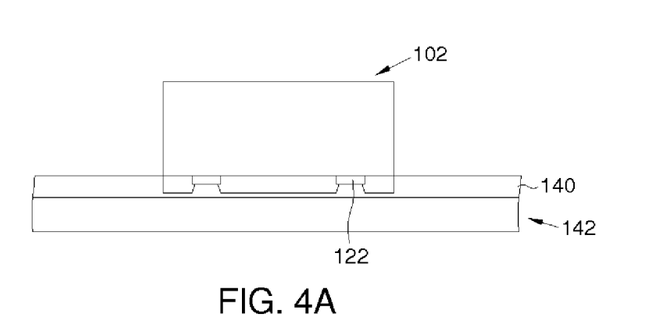
FIG. 4A through FIG. 4F show a manufacturing method of the semiconductor package of FIG. 1 and the stacked package assembly of FIG. 2, according to an embodiment of the invention.

First, in operation S102, a carrier 142 and an adhesive layer 140 of FIG. 4A are provided.

Next, in operation S104, as indicated in FIG. 4A, multiple semiconductor devices 102 are disposed adjacent to the adhesive layer 140. In particular, after circuits are manufactured and divided on a wafer, the semiconductor devices 102 are re-distributed adjacent to the adhesive layer 140, with the first pads 122 of each semiconductor device 102 facing the adhesive layer 140. According to the method of the illustrated embodiment, the re-distributed semiconductor devices 102 are then packaged to form a re-distributed wafer, so that resulting semiconductor packages can be referred as chip-scale packages (CSP's) or wafer-level packages (WLP's). For ease of presentation, one semiconductor device 102 is illustrated in FIG. 4A and discussed below. However, it should be recognized that similar operations can be carried out sequentially or in parallel on additional semiconductor devices 102.

Re-distributed semiconductor devices 102 can be separated by a suitable distance, so that solder balls can be formed between two adjacent semiconductor devices 102. For example, the solder balls 112 are disposed between the side surface 158 and an outer side surface 146 of the package body 104 as indicated in FIG. 1. Thus, the semiconductor package 100 of FIG. 1 can correspond to a fan-out semiconductor package after singulation.

Figure 4B:
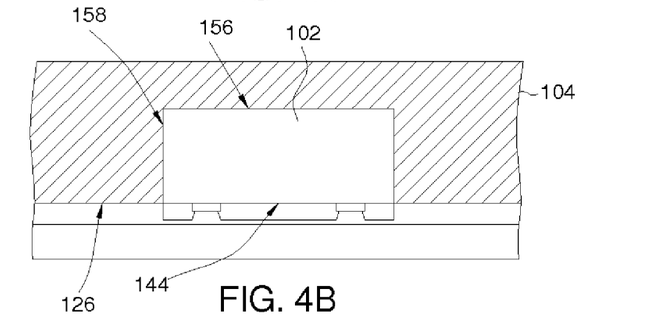

Then, in operation S106, as indicated in FIG. 4B, the package body 104 is formed, such as by applying an encapsulant using packaging technology, so as to cover the side surface 158 and the back surface 156 of the semiconductor device 102, wherein the first package surface 126 is aligned (e.g., substantially aligned) with the active surface 144. The package body 104 can include a Novolac-based resin, an epoxy-based resin, a silicone-based resin, or other suitable encapsulant. The package body 104 also can include a suitable filler, such as powdered silicon dioxide. Examples of the packaging technology noted above include compression molding, injection molding, and transfer molding. In some implementations, a thickness of the package body 104 can be reduced, such as by routing or grinding, such that the thickness of the package body 104 is substantially the same as a thickness of the semiconductor device 102, thereby exposing the back surface 156 of the semiconductor device 102.

Figure 4C:
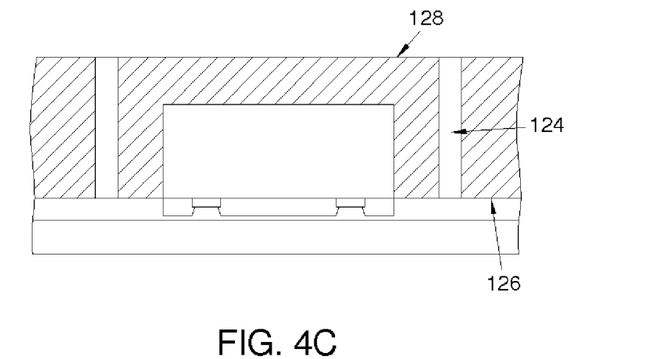

Then, in operation S108, as indicated in FIG. 4C, the vias 124 are formed in the package body 104, such as by using laser drilling technology, mechanical drilling technology, or other material-removal technology. The vias 124 extend from the first package surface 126 to the second package surface 128.

Figure 4D:
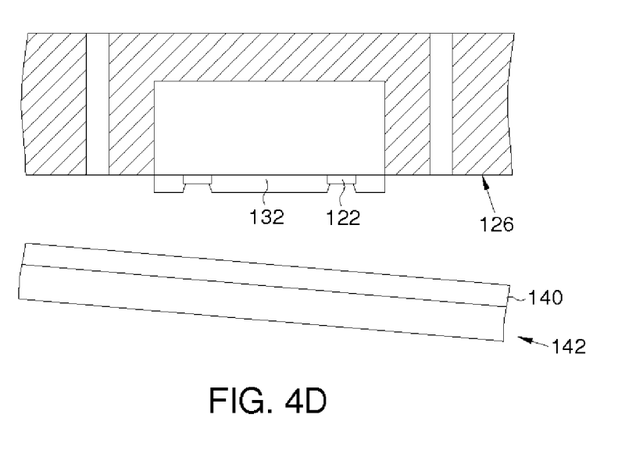

After that, in operation S110, as indicated in FIG. 4D, the carrier 142 and the adhesive layer 140 are removed, and the first pads 122 and the device protection layer 132 are exposed adjacent to the first package surface 126 of the package body 104.

Figure 4E:
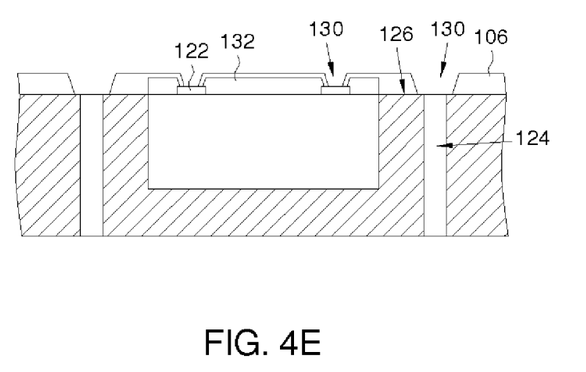

In operation S110, the re-distributed wafer is inverted so that the first package surface 126 faces upwards as indicated in FIG. 4E.

Afterwards, in operation S112, as indicated in FIG. 4E, a dielectric material is applied to cover the first package surface 126, the device protection layer 132, and the first pads 122, and then the first apertures 130 are formed in the dielectric material by patterning technology to form the first dielectric layer 106. The vias 124 and the first pads 122 are exposed by the first apertures 130. For example, the dielectric material can be applied by printing, spinning, or spraying, and patterning can be carried out by photolithography, chemical etching, laser drilling, mechanical drilling, or laser cutting.

Figure 4F:
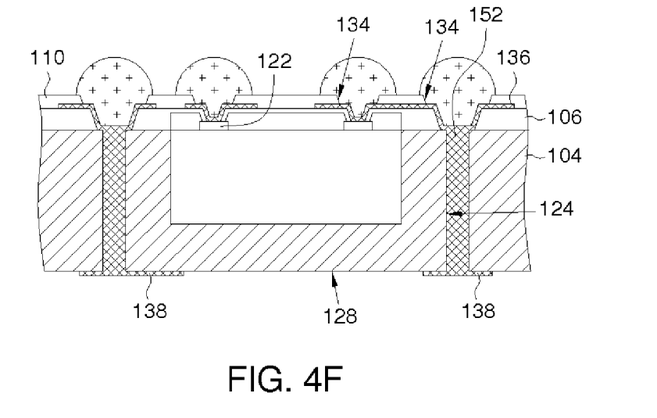

Following that, in operation S114, as indicated in FIG. 4F, an electrically conductive material is applied into the vias 124 and is also applied to cover the first dielectric layer 106 and the second package surface 128, and then the electrically conductive material is patterned to form the first patterned conductive layer 136, the second patterned conductive layer 138, and the via conductive structures 152. For example, the electrically conductive material can be applied by chemical vapor deposition, electroless plating, electrolytic plating, printing, spinning, spraying, sputtering, or vacuum deposition.

In particular, the electrically conductive material applied into the vias 124 forms the via conductive structures 152. Also, the electrically conductive material, which is applied to the first dielectric layer 106, is patterned to form the first patterned conductive layer 136, which extends along the first dielectric layer 106 and at least partially into the first apertures 130 (illustrated in FIG. 4E) so as to be electrically connected with ends of the via conductive structures 152. Moreover, the electrically conductive material, which is applied to the second package surface 128, is patterned to form the second patterned conductive layer 138, which extends along the second package surface 128 and is electrically connected with opposite ends of the via conductive structures 152.

In the present operation S114, the first patterned conductive layer 136, the via conductive structures 152, and the second patterned conductive layer 138 can be formed substantially simultaneously in the same operation. In other implementations, the first patterned conductive layer 136, the via conductive structures 152, and the second patterned conductive layer 138 can be formed from the same or different electrically conductive materials and in the same or separate operations.

Then, in operation S116, the second dielectric layer 110 of FIG. 4F is formed adjacent to the first patterned conductive layer 136 by applying and patterning a dielectric material as discussed above for the first dielectric layer 106. The second dielectric layer 110 defines the second apertures 134, wherein certain ones of the second apertures 134 expose the via conductive structures 152, and other ones of the second apertures 134 expose a portion of the first patterned conductive layer 136. In FIG. 4F, locations of certain ones of the second apertures 134 correspond to those of the first pads 122. In other implementations, the second apertures 134 and the first pads 122 can be separated at a particular distance along the lateral extending direction of the second dielectric layer 110. Also in FIG. 4F, locations of certain ones of the second apertures 134 correspond to those of the via conductive structures 152. In other implementations, the second apertures 134 and the via conductive structures 152 can be separated at a particular distance along the lateral extending direction of the second dielectric layer 110.

The first dielectric layer 106, the first patterned conductive layer 136, the via conductive structures 152, the second patterned conductive layer 138, and the second dielectric layer 110 are formed after multiple semiconductor devices 102 are re-distributed within the re-distributed wafer, and, therefore, can be referred together as a set of re-distribution layers (RDL's).

Then, in operation S118, the solder balls 112 of FIG. 1 and FIG. 4F are disposed in the second apertures 134 and electrically connected to the first patterned conductive layer 136.

In operation S118, the re-distributed wafer as illustrated in FIG. 4F can be inverted so that the second package surface 128 faces upwards.

Then, in operation S120, the first stud bumps 114 of FIG. 1 are formed adjacent to the second patterned conductive layer 138 by wire bonding technology, thus forming a package structure. In particular, the first stud bumps 114 can be formed by cutting or twisting off a wire using a wiring tool. In another implementation, inverting the re-distributed wafer in operation S118 can be omitted according to an operation mode of the wiring tool.

After that, in operation S122, the package structure is singulated to separate multiple semiconductor packages 102. Thus, the semiconductor package 100 of FIG. 1 is formed.

As indicated in FIG. 1, a cutting path passes through the package body 104, the first dielectric layer 106, and the second dielectric layer 110, which are overlapped with one another, so that, after singulation, an outer side surface 146 of the package body 104, an outer side surface 148 of the first dielectric layer 106, and an outer side surface 150 of the second dielectric layer 110 are aligned (e.g., substantially aligned). The outer side surface 146 of the package body 104 extends between the first package surface 126 and the second package surface 128 opposite to the first package surface 126.

Then, in operation S124, the semiconductor element 118 of FIG. 2 is provided. After that, in operation S126, the first stud bumps 114 are bonded to the second pads 120 by ultrasonic bonding technology to stack the semiconductor element 118 on the first stud bumps 114. Thus, the assembly 200 of FIG. 2 is formed.

Figure 5:
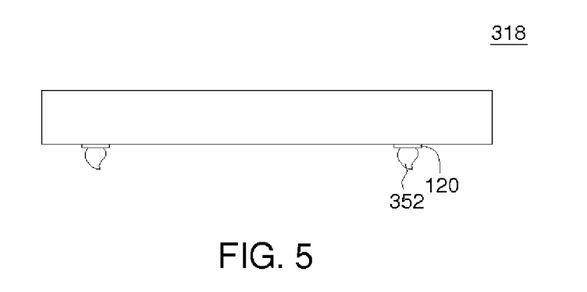
FIG. 5 shows a semiconductor element according to another embodiment of the invention.

Referring next to FIG. 5, a semiconductor element 318 according to another embodiment of the invention is shown. The semiconductor element 318 is similar to the semiconductor element 118 of FIG. 2, and at least one difference is that the semiconductor element 318 further includes a set of second stud bumps 352. Characteristics and formation of the second stud bumps 352 can be similar to those of the first stud bumps 114, and those aspects are not repeated here.

Like the manufacturing method of the assembly 200, the first stud bumps 114 of FIG. 1 can be bonded to the second stud bumps 352 of the semiconductor element 318 of FIG. 5 by ultrasonic bonding technology, so that the semiconductor element 318 can be stacked on the first stud bumps 114 to form a stacked package assembly. It is also contemplated that stacking can be achieved using the second stud bumps 352, in the absence of the first stud bumps 114.

In another implementation, the semiconductor element 318 can be realized by a semiconductor package that is similar to the semiconductor package 100 of FIG. 1. In such manner, two or more semiconductor packages (similar to the semiconductor package 100) can be stacked by ultrasonic bonding technology.

According to embodiments of the invention, a semiconductor package includes a stud bump, which is formed by wire bonding technology and can be bonded or joined to a semiconductor element to form a stacked package assembly. Since the process of bonding the semiconductor element to the stud bump can be carried out without reflow, an undesirable deformation resulting from high temperatures can be controlled or reduced.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:
1. A manufacturing method, comprising:
providing a carrier;
disposing a semiconductor device over the carrier such that an active surface of the semiconductor device faces the carrier, wherein the semiconductor device includes a pad adjacent to the active surface;

forming a package body over the carrier and the semiconductor device, wherein the package body includes a first package surface and a second package surface opposite to the first package surface, and the first package surface faces the carrier;

forming a through-hole in the package body, wherein the through-hole extends between the first package surface and the second package surface;

separating the carrier from the package body;

forming a dielectric layer adjacent to the first package surface, wherein the dielectric layer exposes the pad and the through-hole;

forming a conductive via in the through-hole, wherein the conductive via includes a first end, adjacent to the first package surface, and a second end, adjacent to the second package surface;

forming a patterned conductive layer adjacent to the dielectric layer, wherein the patterned conductive layer is electrically connected to at least one of the pad and the first end of the conductive via; and forming a stud bump adjacent to the second end of the conductive via.

2. The manufacturing method of claim 1, wherein forming the stud bump is carried out using a wiring tool.

3. The manufacturing method of claim 1, wherein the stud bump is one of a gold stud bump, an aluminum stud bump, and a copper stud bump.

4. The manufacturing method of claim 1, wherein forming the conductive via and forming the patterned conductive layer are carried out substantially simultaneously.

5. The manufacturing method of claim 1, wherein the patterned conductive layer is a first patterned conductive layer, and further comprising:

forming a second patterned conductive layer adjacent to the second package surface, wherein the second patterned conductive layer is electrically connected to the second end of the conductive via and the stud bump.

6. The manufacturing method of claim 5, wherein forming the stud bump is such that the stud bump is laterally displaced from the conductive via.

7. The manufacturing method of claim 6, wherein forming the stud bump is such that the stud bump is inwardly disposed with respect to the conductive via.

8. A manufacturing method, comprising:
providing a package structure including:
providing a package body comprising a semiconductor device including an active surface and a pad adjacent to the active surface, wherein the pad of the semiconductor device is exposed adjacent to a lower surface of the package body,
creating a through hole extending between the lower surface of the package body and an upper surface of the package body,
filling the through hole with a conductive via, and
forming an upper patterned conductive layer adjacent to the upper surface of the package body and electrically connected to an upper end of the conductive via; and
forming a stud bump over the upper patterned conductive layer, wherein the stud bump is laterally displaced from the conductive via.

9. The manufacturing method of claim 8, wherein forming the stud bump is such that the stud bump includes a base portion and a protruded neck portion.

10. The manufacturing method of claim 8, wherein forming the stud bump is such that the stud bump is inwardly disposed with respect to the conductive via.

11. The manufacturing method of claim 8, wherein forming the stud bump is such that the stud bump is disposed outwardly of the side surface of the semiconductor device.

12. The manufacturing method of claim 8, wherein providing the package structure is such that the package structure further includes a lower patterned conductive layer adjacent to the lower package surface and electrically connected to the pad of the semiconductor device and a lower end of the conductive via.

13. The manufacturing method of claim 8, wherein the pad is a first pad, and further comprising:
providing a semiconductor element including a second pad; and
bonding the stud bump to the second pad to form a stacked package assembly.

14. The manufacturing method of claim 13, wherein bonding the stud bump to the second pad is carried out by applying a temperature lower than a reflow temperature.

15. The manufacturing method of claim 8, wherein the stud bump is a first stud bump, and further comprising:
providing a semiconductor element including a second stud bump; and
bonding the first stud bump to the second stud bump to form a stacked package assembly.

16. The manufacturing method of claim 15, wherein bonding the first stud bump to the second stud bump is carried out by applying a temperature lower than a reflow temperature.

17. The manufacturing method of claim 15, wherein bonding the first stud bump to the second stud bump is carried out by applying ultrasonic energy.

18. A manufacturing method, comprising:
providing a package structure including:
a semiconductor device including a pad,
a package body encapsulating the semiconductor device with the pad exposed adjacent to a lower surface of the package body,
a conductive structure at least partially extending between the lower surface of the package body and an upper surface of the package body,
an upper patterned conductive layer extending from an upper end of the conductive structure and along the upper surface of the package body, and
a lower patterned conductive layer extending from a lower end of the conductive structure and along the lower surface of the package body; and
forming a stacking element over the upper patterned conductive layer, wherein the stacking element includes a base portion and a protruded portion disposed over the base portion, and the stacking element is laterally displaced from the conductive structure.

19. The manufacturing method of claim 18, wherein the stacking element is a stud bump.

20. The manufacturing method of claim 18, wherein forming the stacking element is such that the stacking element is laterally disposed between the semiconductor device and the conductive structure.

* * * * *